United States Patent
Raber et al.

(10) Patent No.: US 7,226,894 B2
(45) Date of Patent: Jun. 5, 2007

(54) SUPERCONDUCTING WIRE, METHOD OF MANUFACTURE THEREOF AND THE ARTICLES DERIVED THEREFROM

(75) Inventors: Thomas Robert Raber, Schenectady, NY (US); Judson Sloan Marte, Wynantskill, NY (US); Evangelos Trifon Laskaris, Niskayuna, NY (US); Sergio Martins Loureiro, Saratoga Springs, NY (US); Robert John Zabala, Schenectady, NY (US); Bruce Alan Knudsen, Amsterdam, NY (US); Kathleen Melanie Amm, Clifton Park, NY (US); Bruce Campbell Amm, Clifton Park, NY (US); James William Bray, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 471 days.

(21) Appl. No.: 10/691,368

(22) Filed: Oct. 22, 2003

(65) Prior Publication Data

US 2005/0090403 A1   Apr. 28, 2005

(51) Int. Cl.
- *H01B 12/00* (2006.01)
- *H01L 39/24* (2006.01)
- *C04B 35/58* (2006.01)
- *C23C 26/00* (2006.01)

(52) U.S. Cl. .................... 505/430; 505/433; 505/452; 505/704; 505/230; 427/62; 427/124; 174/125.1; 252/500; 423/289

(58) Field of Classification Search .............. 505/100, 505/124, 230, 430, 433, 452, 704, 705, 736, 505/329, 740, 925, 977; 174/125.1; 29/599, 29/592.1; 427/62, 124; 228/176; 428/403, 428/930; 438/119; 156/158

See application file for complete search history.

(56) References Cited

U.S. PATENT DOCUMENTS

| | | | |
|---|---|---|---|
| 4,725,707 A | * | 2/1988 | Kuchuk-Yatsenko et al. .... 219/100 |
| 5,082,164 A | | 1/1992 | Rumaner et al. ........... 228/176 |
| 5,952,270 A | | 9/1999 | Hughson et al. ............ 505/433 |

(Continued)

FOREIGN PATENT DOCUMENTS

DE    10114934    9/2002

(Continued)

OTHER PUBLICATIONS

Flukiger et al, Superconducting properties of MgB2 tapes and wires, Physica C, 2003, 385, 286-305.*

(Continued)

*Primary Examiner*—Mark Kopec
*Assistant Examiner*—Kallambella Vijayakumar
(74) *Attorney, Agent, or Firm*—GE Global Patent Operation

(57) ABSTRACT

Disclosed herein is method for making a wire comprising contacting a first end of a first superconducting wire with a second end of a second superconducting wire, wherein the superconducting wire comprises a superconducting filament having a superconducting composition comprising magnesium diboride; heating the first end of the first superconducting wire with the second end of the second superconducting wire at a point to form a joint, wherein the superconducting filament having the superconducting composition is in continuous electrical contact with any other part of the superconducting filament after the formation of the joint.

15 Claims, 3 Drawing Sheets

U.S. PATENT DOCUMENTS

| | | | | |
|---|---|---|---|---|
| 5,962,865 | A | 10/1999 | Kerber et al. | 257/30 |
| 5,987,731 | A | 11/1999 | Yamazaki | 29/599 |
| 6,038,461 | A | 3/2000 | Sakai et al. | 505/230 |
| 6,143,697 | A | 11/2000 | Tatekawa et al. | 505/491 |
| 6,281,171 | B1 | 8/2001 | Ihara et al. | 505/125 |
| 6,335,108 | B1 | 1/2002 | LaGraff et al. | 428/689 |
| 6,436,875 | B2 | 8/2002 | Masur et al. | 505/500 |
| 6,447,714 | B1 | 9/2002 | Goyal et al. | 419/28 |
| 6,458,223 | B1 | 10/2002 | Hans Thieme et al. | 148/435 |
| 6,470,564 | B1 | 10/2002 | Wada | 29/599 |
| 6,503,344 | B2 | 1/2003 | Baudis et al. | 148/279 |
| 6,511,943 | B1 | 1/2003 | Serquis et al. | 505/300 |
| 6,514,557 | B2 | 2/2003 | Finnemore et al. | 427/62 |
| 6,573,220 | B1 | 6/2003 | Mannhart et al. | 505/126 |
| 6,583,362 | B2 | 6/2003 | Benz et al. | 174/125.1 |
| 6,586,370 | B1 | 7/2003 | Holcomb | 505/236 |
| 6,591,119 | B2 | 7/2003 | Finnemore et al. | 505/230 |
| 6,630,427 | B2 * | 10/2003 | Dunand | 505/452 |
| 2001/0055696 | A1 * | 12/2001 | Furuichi | 428/610 |
| 2002/0004460 | A1 | 1/2002 | Masur et al. | 505/100 |
| 2002/0013231 | A1 | 1/2002 | Ihara et al. | 505/125 |
| 2002/0035039 | A1 | 3/2002 | Nassi et al. | 505/100 |
| 2002/0038719 | A1 | 4/2002 | Nassi et al. | 174/125.1 |
| 2002/0058143 | A1 | 5/2002 | Hunt et al. | 428/412 |
| 2002/0111275 | A1 | 8/2002 | Finnemore et al. | 505/100 |
| 2002/0132739 | A1 | 9/2002 | Kang et al. | 505/123 |
| 2002/0164418 | A1 | 11/2002 | Fischer et al. | 427/180 |
| 2002/0165100 | A1 | 11/2002 | Bielefeldt et al. | 505/237 |
| 2002/0173428 | A1 * | 11/2002 | Thieme et al. | 505/100 |
| 2002/0189533 | A1 | 12/2002 | Kim et al. | 117/101 |
| 2002/0198111 | A1 | 12/2002 | Tomsic | 505/230 |
| 2003/0017949 | A1 | 1/2003 | Akimitsu et al. | 505/100 |
| 2003/0032560 | A1 | 2/2003 | Otto et al. | 505/100 |
| 2003/0036482 | A1 | 2/2003 | Thieme et al. | 505/100 |
| 2003/0051901 | A1 * | 3/2003 | Morita et al. | 174/125.1 |
| 2003/0082412 | A1 | 5/2003 | Fukuda et al. | 128/697 |
| 2003/0096711 | A1 | 5/2003 | Saito et al. | 505/825 |
| 2003/0099871 | A1 | 5/2003 | Finnemore et al. | 428/704 |
| 2003/0125213 | A1 | 7/2003 | Kwon et al. | 505/100 |
| 2003/0130130 | A1 | 7/2003 | Shimakage et al. | 505/300 |
| 2003/0146417 | A1 | 8/2003 | Romonovich et al. | 252/500 |
| 2003/0150744 | A1 | 8/2003 | Yoshii et al. | 205/358 |
| 2003/0164246 | A1 | 9/2003 | Nassi et al. | 174/125.1 |
| 2004/0009879 | A1 * | 1/2004 | Giunchi et al. | 505/230 |

FOREIGN PATENT DOCUMENTS

| | | | |
|---|---|---|---|
| JP | 2002-324445 | * | 11/2002 |
| JP | 2003-086265 | * | 3/2003 |
| KR | 2003-010964 | * | 2/2003 |
| WO | WO 02/064859 | | 8/2002 |
| WO | WO 02/069353 | | 9/2002 |
| WO | WO 02/083562 | | 10/2002 |
| WO | WO 03/005460 | | 1/2003 |

OTHER PUBLICATIONS

Canfield et al, "Superconductivity of denseMgB2 Wires," Phy. Rev. lett., 2001, 86(11), 2423-2426.*

Service, "MgB2 Trades Performance for a shot at the real world," Science, 2002, 295, 786-788.*

Giunchi, "High Density MgB2 obtained by reactive Liquid Mg Infiltration," SATT11 Conference, Vietri S.M..(SA) Italy, Mar. 19-22, 2002.*

Nagamatsu, et al., "Superconductivity at 39K in magnesium diboride". Nature, vol. 410. pp. 63-64. Mar. 2001.

Labalestier, et al. "Strongly linked current flow in polycrystalline forms o f the superconductor MgB2". Nature. vol. 410. pp. 186-189. Mar. 2001.

Canfield, et al. "Superconductivity in Dense MgB2 Wires" Physical Review Letters. vol. 86. No. 11.pp. 2423-2426. Mar. 12, 2001. The American Physical Society.

Service, et al. "MgB2 Trades Performance for A Shot at the Real World". www.sciencemag.org.Science. vol. 295. pp. 786-788. Feb. 1, 2002.

Canfield, et al. "Magnesium diboride: one year on"., Superconductivity. Physics World. physicsweb.org. pp. 29-34. Jan. 2002.

K. Komori, et al. "A New Approach for the Fabrication of MgB2 Superconductiong Tape with Large In-field Transport Critical Current Density". National Institute for Materials Science, Superconductiong Materials Center, 1-2-1, Sengen, Tsukuba, Ibaraki 305-0047, Japan. (3 pages).

S. Soltanian, et al. "Transport critical current of Solenoidal MgB2/ Cu Coils Fabricated Using a Wind-Reaction In-situ Technique". Supercond. Sci. Technol. 16 (2003) L4-L6. pp. 1-6.

Dou, et al. "Enhancement of the critical current density and flux pinning of MgB2 superconductor by nanoparticle SiC doping". Appl. Phys. Lett. 81, 3419 (2002). pp. 1-6.

Kramer, et al. "Intra-granular TI precipitates in MgB2". Superconductivity; Materials Science. Dated: Feb. 20, 2003. Electronic Address: finnemore@ameslab.gov. pp. 1-6.

Gurevich, et al. "Significant enhancement of the upper critical field in the two-gap superconductor MgB2 by selective tuning of impurity scattering".

Buzea C. Yamashita T: "Review of the Superconducting Properties of MgB2" Superconductor Science and Technology, IOP Publishing, Techno House, Bristol, GB, vol. 14, No. 11, Nov. 11, 2001, pp. R115-R146, XP002954108, ISSN: 0953-2048—p. R121, left hand column, par. 3—p. R123, left-hand column, par. 3.

EPO Search Report dated Mar. 1, 2006.

* cited by examiner the following detailed description and drawings. Referring to the figures wherein like elements are numbered alike.

SUPERCONDUCTING WIRE, METHOD OF MANUFACTURE THEREOF AND THE ARTICLES DERIVED THEREFROM

BACKGROUND

This disclosure is related to superconducting wire, method of manufacture thereof and the articles derived therefrom.

Superconducting wires comprising multiple filaments are often used in a variety of electromagnetic applications, such as magnets, motors, and transformers. Recently, magnesium diboride ($MgB_2$) was found to exhibit superconducting properties. It is thought that magnesium diboride may be an alternative to conventional superconductors such as niobium-titanium (NbTi) or bismuth, strontium, calcium, copper and oxygen (BSCCO) in the 20–30 K and 0–3 T range for the fabrication of conductor tapes or wires. One process for the development of magnesium diboride wires has been to expose boron filaments to magnesium vapor. This process has not resulted in the development of large lengths (greater than 500 meters) of superconducting wire. It is therefore desirable to develop a method for obtaining magnesium diboride wires of lengths larger than or equal to about 350,000 feet.

BRIEF DESCRIPTION OF THE INVENTION

Disclosed herein, is a method of manufacturing a wire comprising filling a hole in a metal tube with magnesium; sealing the ends of the tube; deforming the tube to increase it length; and contacting the tube with boron to react the magnesium with the boron to form superconducting magnesium diboride.

Disclosed herein too is a method for making a superconducting wire comprising contacting a boron filament, boron tape, or a combination comprising an assembly of boron filaments or tapes with molten magnesium to form a magnesium diboride wire.

Disclosed herein too is method for making a wire comprising contacting a first end of a first superconducting wire with a second end of a second superconducting wire, wherein the superconducting wire comprises a superconducting filament having a superconducting composition comprising magnesium diboride; heating the first end of the first superconducting wire with the second end of the second superconducting wire at a point to form a weld, wherein the superconducting filament having the superconducting composition is in continuous electrical contact with any other part of the superconducting filament after the formation of the weld.

Disclosed herein too is a method of manufacturing a wire comprising extruding a preform comprising a metal matrix and at least one filament; wherein the filament comprises a superconducting composition comprising magnesium diboride to form an extruded preform; and wire drawing or swaging the extruded preform to form the superconducting wire.

Disclosed herein too are articles manufactured using the aforementioned method and the aforementioned wire.

BRIEF DESCRIPTION OF FIGURES

The above detailed and other features are exemplified by the following detailed description and drawings. Referring to the figures wherein like elements are numbered alike.

DETAILED DESCRIPTION OF PREFERRED EMBODIMENTS

Described herein are methods for manufacturing large lengths of superconducting wires, wherein the wires comprise filaments of magnesium diboride. The filaments are generally welded together to from wires having lengths of greater than or equal to about 350,000 feet, preferably greater than or equal to about 500,000 feet, and more preferably greater than or equal to about 1,000,000 feet. Preferred methods of joining are electron beam welding and laser beam welding.

The wires may be advantageously formed into other similar electrically conducting structures, such as flattened tapes and wound multi-wire cables. Applications for superconducting wires are found in electromagnetic devices such as superconducting magnets, motors, transformers, and generators. Such electromagnetic devices may in turn be incorporated into larger systems, such as, for example, a magnetic resonance imaging system.

Figure 1:
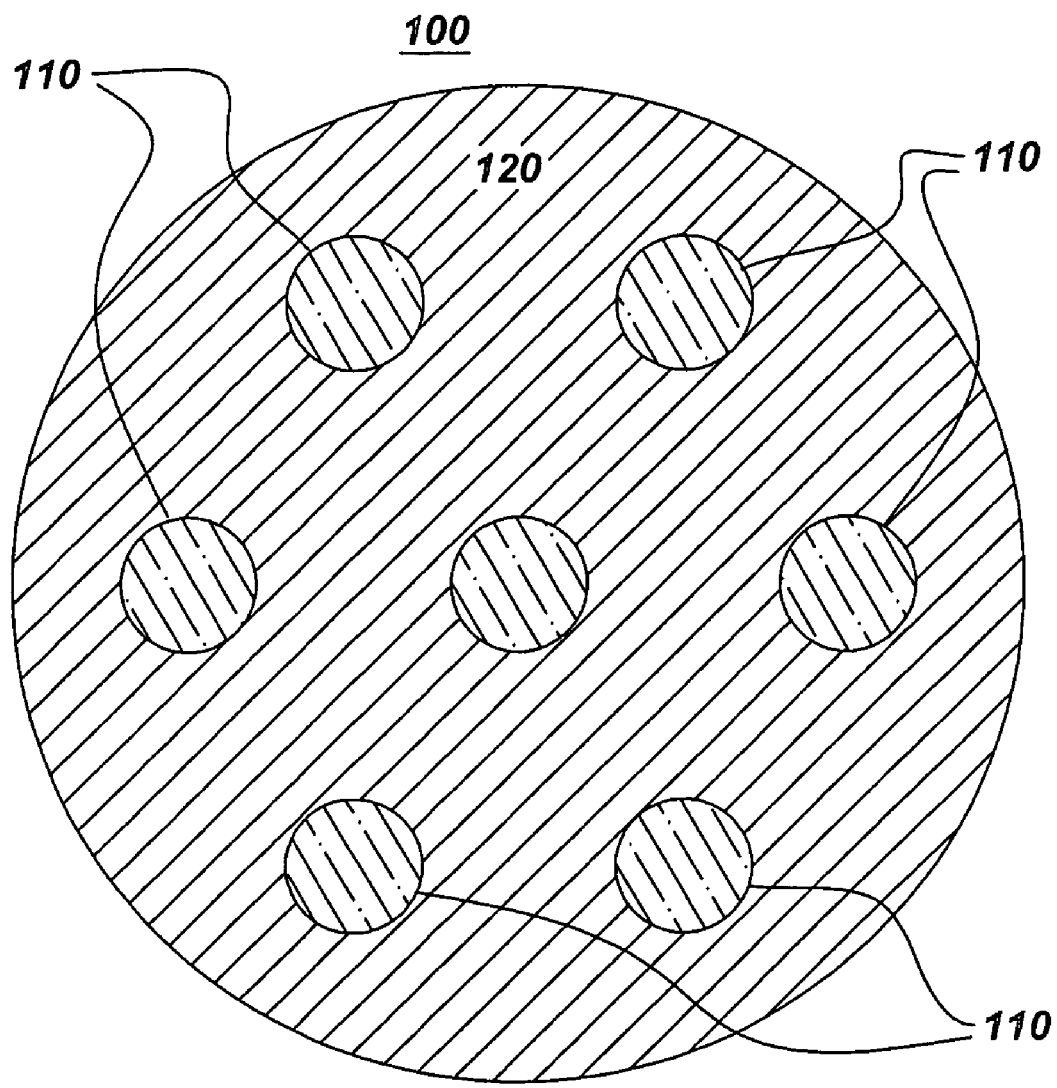
FIG. 1 is a schematic representation of a cross-sectional view of the superconducting wire.

FIG. 1 is a schematic representation of a cross-sectional view of one exemplary embodiment of the superconducting wire 100. Superconducting wire 100 includes at least one filament 110 having a superconducting composition. Although seven such filaments 110 are represented in the FIG. 1, there is no limit to the number of filaments 110 contained within superconducting wire 100. In one embodiment as shown in the FIG. 1, at least a portion of the filaments are encapsulated in an optional metal matrix 120, which facilitates the establishment of continuous length of superconducting filament. In another exemplary embodiment (not shown), the superconducting wire 100 does not have a metal matrix and consists essentially of one or more filaments 110 comprising a superconducting composition.

As stated above, the filament 110 comprises a superconducting composition. The superconducting composition comprises primarily magnesium diboride ($MgB_2$), which has a superconducting transition temperature ($T_c$) of approximately 39 K. Magnesium diboride has a supercritical conductivity temperature $T_c$ that is higher by almost a factor of two of any known non-oxide and non-$C_{60}$-based compound. The magnesium diboride superconducting composition preferably contains a first superconducting phase of magnesium and boron, but may optionally contain other dopants such as a metallic phase support. In an exemplary embodiment, the first superconducting phase is magnesium diboride. Alternatively, the first superconducting phase can be a solid solution between magnesium diboride and another component, such as titanium boride and/or titanium diboride. The superconducting compositions can optionally comprise a second superconducting phase that has the same or a related crystallographic structure as the magnesium diboride and having comparable superconducting properties.

The dopants in addition to providing metallic phase support may be incorporated for purposes of changing lattice configurations or spacing and/or improving superconducting properties. Depending upon the chemical composition of the first superconducting phase, useful dopants that may be added include copper, gold, silver, magnesium, zinc, lead, cadmium, tin, bismuth, gallium, mercury and indium or combinations comprising at least one of the foregoing dopants. In one exemplary embodiment, the magnesium diboride comprises additional elemental magnesium. The elemental magnesium is generally added because of its inertness.

Irrespective of the other components present in the superconducting composition, the superconducting composition has a superconducting phase in a volume fraction effective to provide superconductivity at an operative critical temperature. In one embodiment, the superconducting phase may occupy a volume of greater than or equal to about 19 volume percent of the total superconducting composition. It is generally preferred for the volume fraction of the first superconducting phase to be present in an amount of greater than or equal to about 25, preferably greater than or equal to about 35, preferably greater than or equal to about 50, and more preferably greater than or equal to about 75 volume percent of the total superconducting composition. Lower volume fractions of the first superconducting phase may also be used in applications where electrical currents are generally transmitted over short distances, but where the magnetic properties are of interest.

The superconducting wire comprises at least one filament having a filament characteristic dimension, wherein the filament is continuous and comprises a plurality of magnesium diboride grains, and wherein the plurality of magnesium diboride grains have an average grain size of less than or equal to about 10 percent of the filament characteristic dimension. The superconducting wire also comprise a metallic matrix surrounding and contacting the at least one filament, wherein the metallic matrix is electrically conductive at temperatures below about 20 K and has a coefficient of thermal expansion that is substantially the same as or greater than that of magnesium diboride. The characteristic dimension is the smallest dimension of the filament, such as the diameter of a filament having a circular cross-section, or the minor axis of a filament having an elliptical cross-section.

In one embodiment, the magnesium diboride grains in the superconducting composition has an average size of less than or equal to about 500 nanometers, with less than or equal to about 300 nanometers preferred, less than or equal to about 200 nanometers more preferred and less than or equal to about 100 nanometers even more preferred. The size as referred to herein is the maximum dimension of the grains of magnesium diboride.

The metallic matrix material 120 is optional, but when used is preferably electrically conductive at cryogenic temperatures (i.e., below about 77 K). In order to prevent breakage of wire 100 during cycling between room temperature and cryogenic temperatures, the metallic matrix has a coefficient of thermal expansion that is compatible with that of the plurality of superconducting composition grains that form the at least one filament 110. When metallic matrix 120 has a coefficient of thermal expansion that is substantially the same as that of the superconducting composition, zero strain is imparted to the at least one filament 110. When metallic matrix 120 has a coefficient of thermal expansion that is greater than that of the superconducting composition, a compressive stress—which tends to increase the critical current of the at least one filament 110 and superconducting wire 100 is imparted to the at least one filament 110. If metallic matrix 120 has a coefficient of thermal expansion that is less than that of the superconducting composition, a tensile strain—which tends to decrease the critical current of the at least one filament 110 and superconducting wire 100 is imparted to the at least one filament 110. Thus, metallic matrix 120 should have a coefficient of thermal expansion that is substantially the same as or greater than that of the superconducting composition. The metal matrix generally comprises a material that can withstand the elevated temperatures of the heat treatment process. It is preferable for the metal matrix to be electrically conductive. The metal matrix comprises copper or a copper alloy, or the metal matrix is selected from the group consisting of stainless steel, tantalum, magnesium or an oxide dispersion strengthened copper and nickel alloys.

The metal matrix may be a tube, a billet, and the like, having holes into which the either the superconducting composition or the precursors to the superconducting composition (such as magnesium and boron) may be deposited. In an optional embodiment, the metal matrix is comprised of copper or a copper alloy, with a second metal layer disposed between the superconducting composition and the copper. The second metal layer is either a barrier layer or a high resistivity layer. In one embodiment, the barrier layer is selected from the group consisting of tantalum, niobium, nickel, nickel alloys, iron, tungsten, molybdenum and combinations thereof. In another embodiment, the resistivity layer is selected from the group consisting of cobalt, manganese, a nickel titanium alloy or a nickel zirconium alloy.

If the tube has more than one hole, it is generally desirable for the holes to have the same average radius. The radiuses of the individual holes do not, however, always have to be equal to another. In addition the holes may have any desired geometry. For example while the geometrical cross-section of one hole is circular, the other may be elliptical, and so on. The ratio of the radius of any one hole to the radius of the tube may be about 0.1 to about 0.99. Within this range, a ratio of greater than or equal to about 0.15, preferably greater than or equal to about 0.2, and more preferably greater than or equal to about 0.25 is desirable.

Filaments having the superconducting composition may be manufactured by a number of different methods. In one exemplary method of manufacturing the superconducting composition in the form of a wire, the metallic tube having at least one cylindrical hole through its length is filled with the superconducting composition and is then subjected to a deformation process to reduce the cross-sectional area of the tube as well as to increase its length. In an exemplary embodiment, the superconducting composition comprises magnesium diboride. The superconducting composition may also consist essentially of magnesium diboride. The metallic tube may have any number of non-intersecting holes that extend from a first end of the tube through to the second end of the tube and at least one of these holes is filled with the superconducting composition prior to the elongation process. The first end and the second end of the tube are each located at a diametrical cross-section of the tube. It is generally desirable for the particles that constitute the superconducting composition to be in electrical communication with at least one other particle of the powder prior to the deformation process.

The metallic tube containing the magnesium diboride is then sealed prior to the deformation. The deformation may involve processes such as extrusion, forging, rolling, swaging, drawing, and the like, as well as combinations comprising at least one of the foregoing processes. The deformation is conducted to extend the length of the tube and to reduce the cross-sectional area. It is generally desirable for the change in length per deformation process to be greater than or equal to about 5%, based on the original length of the tube. In general a change is length of greater than or equal to about 10, preferably greater than or equal to about 50, and more preferably greater than or equal to about 100% of the original length is desirable. The deformation of the tube is generally conducted in such a manner so as to permit the particles of the superconducting composition in the hole to be in continuous electrical communication with one another to form the filament 110.

The tube is generally deformed to form a superconducting wire having a cross sectional area of about 0.1 mm$^2$ to about 5 mm$^2$. Within this range, cross sectional areas of greater than or equal to about 0.2, preferably greater than or equal to about 0.3, and more preferably greater than or equal to about 0.5, can be used. Also desirable within this range are cross sectional areas of less than or equal to about 4.5, preferably less than or equal to about 4.2, and more preferably greater than or equal to about 3.5. In general, the metal matrix comprises about 20% to about 80% of the cross-sectional area of the superconducting wire. Within this range, the metal matrix may comprise cross sectional areas of greater than or equal to about 25, preferably greater than or equal to about 30, and more preferably greater than or equal to about 35%, of the superconducting wire. The metal matrix may also comprise a cross sectional area of less than or equal to about 75, preferably less than or equal to about 70, and more preferably less than or equal to about 65%, of the superconducting wire. The wire may be further flattened to a tape or film if desired.

Following the deformation process, the wire, tape or film may be heat treated to improve the superconducting properties and/or the mechanical properties. The heat treatment process involves the heating the wire to a temperature of greater than or equal to about 600° C., preferably greater than or equal to about 800° C., and even more preferably greater than or equal to about 900° C. The time period for the heat treatment is about 1 to about 6 hours. The preferred period for the heat treatment is greater than or equal to about 2 hours. In general, the wire upon cooling provides the resulting superconducting composition with the composite structure effective for displaying superconducting properties.

In another exemplary method of manufacturing the superconducting wire, a metallic tube having at least one hole is filled with magnesium and boron along with any other desired dopants. An exemplary ratio of magnesium with respect to boron is a ratio of greater than 1:2. Dopants that may be used are copper, gold, silver, magnesium, zinc, lead, cadmium, tin, bismuth, gallium, mercury, indium or combinations comprising at least one of the foregoing metals. The tube is then sealed and subjected to deformation, as noted above, to produce a superconducting wire. The superconducting wire is then heat treated to temperatures of greater than or equal to about 700° C. to produce the magnesium diboride in the wires. As noted above, the superconducting wires may be drawn into films, tapes, and the like.

In yet another exemplary method of manufacturing the superconducting wire, a suitable metallic tube in the form of a billet having at least one hole is filled with magnesium rods, pellets, powder, particles, flakes, and the like. Dopants such as those listed above may also be added into the hole along with the magnesium rods, pellets, powder, particles, flakes, and the like. The metallic tube is preferably of a metal that does not form a boride upon exposure to boron. In addition the metallic tube is preferably of a metal that permits the diffusion of boron through it within a reasonable time period. Suitable examples of the metal used in the metallic tube (billet) for this manner of manufacturing the superconducting wire are a copper alloy, stainless steel, tantalum, magnesium or an oxide dispersion strengthened copper and nickel alloys.

The metallic tube containing the magnesium is then sealed and subjected to deformation to produce a wire having a reduced cross-sectional area and increased length. It is desirable for the magnesium in the wire to exist in the form of a continuous filament having a length equal to that of the wire. This permits the formation of a filament having a superconducting composition through the entire length of the wire upon exposure of the wire to boron.

In order to form the superconducting composition, the wire containing the magnesium filament is contacted with boron to permit the diffusion of boron into the metal and eventually upon heat treatment of the magnesium wires to form a superconducting composition comprising magnesium diboride. A preferred method of contacting the boron with the wire is by exposure to boron or to boron containing compounds. In one method of achieving this, the wire containing the magnesium filament is packed into a metal box (e.g., iron box) containing a powder mixture which comprises a boron releasing substances, activating materials and optional refractory extenders. This process is called boronizing. The sealed boxes are heat treated for a certain period, wherein the desired magnesium boride is formed as the result of a reaction between the boron that has diffused through the metal matrix and magnesium. Boron-releasing substances, which may be considered for use as boronizing agents, are amorphous and crystalline boron, ferroboron, boron carbide and borates such as borax. Suitable activating substances are chloride or fluoride releasing compounds such as alkali metal and alkaline earth metal chlorides or fluorides. Fluoroborates, such as in particular, potassium tetrafluoroborate, are particularly widely used as activators. Boronizing is generally conducted at temperatures of about 800 to about 1,100° C., in particular at about 850 to about 950° C. It is generally desirable to permit the diffusion of an amount of boron into the metal matrix effective to produce a magnesium to boron ratio of greater than 1:2.

While the boron may eventually diffuse through the metal matrix and react with the magnesium filament during the contacting step, an optional additional heat treatment may be performed in order to facilitate the further diffusion of boron to the magnesium filament. The boron will generally diffuse through the matrix into the magnesium filament and react with it to produce the superconducting composition. It is generally desirable to conduct the heat treatment at temperature of greater than or equal to about 600° C. for a time period of greater than or equal to about 1 hour so that a continuously superconducting filament having the superconducting composition is formed. It is generally desirable for the superconducting wire to have the ability to continuously superconduct electricity from a first end to the second end and also for the length of the superconducting filament to be at least equal to or greater than the distance from the first end to the second end of the superconducting wire. In yet another embodiment related to the manufacturing of the superconducting wires, any of the aforementioned methods of preparing the wire may be combined to either produce the wire or to improve its properties.

As disclosed above, superconducting wires that do not have the metal matrix may also be welded into large extended sections having total lengths of greater than or equal to about 350,000 feet. In order to achieve this, the superconducting wire having a superconducting composition is first manufactured without a metal matrix. In this method of manufacturing the superconducting wire, a boron substrate is exposed to either magnesium vapors or molten magnesium in an appropriate reactor to form a superconducting composition that substantially comprises magnesium diboride. In one embodiment, the superconducting composition consists essentially of magnesium diboride, while in another embodiment, the superconducting composition consists of magnesium diboride.

As stated above, in one method of manufacturing a superconducting wire without a metal matrix, a boron substrate in the form of a filament, tape, film, and the like, may be purchased commercially and either placed in a reactor or continuously fed through a reactor containing magnesium vapors. The process may be either a batch process or a continuous process. In one embodiment, the boron substrate may contain suitable dopants if desired or the dopants may be introduced into the boron substrate by contacting the substrate with the magnesium vapors. In another embodiment, the boron substrate may contain some of the dopants, while other dopants may be introduced into the substrate in vapor form by contacting the substrate with the dopant vapors. In yet another embodiment, the boron substrate may either be dopant free or contain only a small proportion of the desired dopant concentration, while the substrate is intermittently contacted with the magnesium or the dopant in vapor form to create the superconducting composition. The weight ratio of magnesium vapor to boron is preferably at least greater than or equal to about 1:2. The magnesium reacts with boron upon contacting it to form the superconducting composition. The superconducting composition may then be removed from the reactor and subjecting to welding.

In one exemplary method of manufacturing the superconducting wire by the aforementioned method, the magnesium vapor is either introduced into the reactor under pressure or is pressurized after being fed into the reactor. The application of pressure, while being optional, generally facilitates an efficient diffusion process and also prevents the loss of magnesium due to its low vapor pressure while in the vapor form. The pressure in the reactor may be varied in an amount of about 1 to about 100 kilogram per square centimeter ($kg/cm^2$). The reactor is preferably maintained at a temperature of about 800 to about 1,550° C. depending upon the pressure. In general, a lower pressure (i.e., below atmospheric pressure) may be used when the reaction is conducted at a temperature of about 800° C., while a pressure equal to ambient atmospheric pressure may be used at temperatures of about 1550° C.

In yet another method for manufacturing the superconducting wire, a boron substrate in the form of a filament, film, tape, and the like, is contacted with magnesium liquid in at least one molten magnesium bath. The magnesium liquid may be contacted with the boron substrate at a temperture of about 650 to about 1090° C. In one embodiment, the magnesium liquid may be contacted with the boron substrate either continuously or intermittently. In other words, the process for making the superconducting composition may be either a batch process or a continuous process. In another embodiment, either the boron substrate or the molten magnesium may contain additional dopants in amounts effective to facilitate the development of superconductivity in the substrate. The molten bath may be pressurized if desirable, and may also contain an inert gas such as argon, nitrogen, or the like, to prevent oxidation of the magnesium or boron.

In yet another embodiment, related to the manufacture of the superconducting wire using either magnesium vapor or molten magnesium, a boron substrate may be introduced into a series of reactors, wherein each reactor may contain one or more of the magnesium vapors, molten magnesium, dopant vapors or molten dopant as is desirable. For example, a portion of the boron substrate may be introduced into a first reactor containing a magnesium vapor, followed by the introduction of the same portion of the substrate into a second reactor containing molten magnesium. The terms "first" and "second" as used herein are not used to indicate the order of the contacting but rather to indicate the use of different reactors. The aforementioned method of manufacturing the superconducting wire using a series of reactors may also be conducted as a batch process or in a continuous process.

While the boron substrate in either of the aforementioned methods may be of any desired length and have any desired characteristic dimension, it is generally desirable for the length of the substrate to be greater than or equal to about 1,000 feet, preferably greater than or equal to about 10,000 feet, preferably greater than or equal to about 12,500, and more preferably greater than or equal to about 15,000 feet. A suitable characteristic dimension is about 1 micrometer to about 1000 micrometers. Within this range it is generally desirable to have a characteristic dimension of greater than or equal to about 2, preferably greater than or equal to about 5, and more preferably greater than or equal to about 8 micrometers. Also desirable within this range is a characteristic dimension of less than or equal to about 900, preferably less than or equal to about 800 and more preferably less than or equal to about 500 micrometers.

Following the manufacturing of the superconducting wire by any of the aforementioned methods, or other known methods, the wire may be welded or diffusion bonded to produce a continuous length of superconducting wire having a length at least equal to the sum of the lengths of each of the superconducting wires that are welded together. In one embodiment, the joining a first superconducting wire to a second superconducting wire produces a superconducting wire having a length greater than or equal to the length of the first superconducting wire or the length of the second superconducting wire.

Diffusion bonding is a solid phase process achieved via atomic migration with no macro-deformation of the portions of the superconducting wire to be bonded. Initial cleanliness of the superconducting wires is desirable. Surface roughness values of less than 0.4 microns are desirable and the samples must be cleaned in acetone prior to bonding. Pressure may be used if desired to effect the diffusion bonding.

In one embodiment, the joining involves contacting a first end of a first superconducting wire with a second end of a second superconducting wire, wherein the superconducting wire comprises a superconducting filament having a superconducting composition comprising magnesium diboride; heating the first end of the first superconducting wire with the second end of the second superconducting wire at a point to form a single wire, wherein the superconducting filament having the superconducting composition is in continuous electrical contact with any other part of the superconducting filament. The point at which the two wires are heated may be a single spot or it may be a section at which the two wires overlap. The joint may be a spot weld or a butt weld, or any other kind of weld desired.

In one embodiment, it is generally desired to join the superconducting wire in a manner effective to have at least one electrically continuous superconducting filament of a length greater than or equal to the length of the joined superconducting wire. In another embodiment, it is desirable to join the superconducting wire in a manner effective to have at least one electrically continuous superconducting filament of a length less than or equal to the length of the joined superconducting wire.

The joining is generally carried out using at least one source of energy, such as, the energy provided by a beam of light, wherein the energy provided by the source is directed at those portions of the superconducting composition that are to be joined together. The interaction of the energy with the superconducting composition facilitates the heating of the composition, and this increase in the temperature may be advantageously utilized to facilitate the joining of the superconducting composition. Preferable methods of joining are electron beam welding, laser welding, ultrasonic welding, plasma arc welding, resistance welding and the like.

In the process of joining a superconducting wire having a metal matrix, the metal matrix is first removed to expose the superconducting composition in the superconducting wires that are to be joined. The metal matrix may be removed by methods such chemical etching, mechanical abrasion such as polishing and grinding, thermal treatments such as melting of degradation, or the like, or combinations comprising at least one of the foregoing methods. Following the removal of the metal matrix, the exposed ends of the superconducting filament may be optionally cleaned with a solvent if desired. The exposed portion of the superconducting filament is then heated by contacting it with a source of energy such as an electron beam, laser beam, plasma arc, resistance heating and the like. The heated portions of the superconducting filaments are then joined together and cooled to form a weld. In one embodiment, the heated superconducting filaments are joined together under pressure. In another embodiment, the joining is generally conducted in an inert atmosphere to prevent oxidation of the superconducting composition in the superconducting filaments.

In another embodiment, after the metal matrix is removed from the ends of the superconducting wire to be joined, the two ends are brought together to form an overlapping section of superconducting wire. A filler material comprising either magnesium diboride powder or a combination of magnesium powder and/or boron powder is placed on the overlapping section of the superconducting wire. Dopants may be optionally added to the overlapping section. The overlapping section is then joined using one of the aforementioned joining methods to form a continuous section of the superconducting filament.

In yet another embodiment, the overlapping section comprising the exposed ends of the superconducting filaments along with a filler material comprising magnesium powder and boron powder are resistively heated. The heating promotes a chemical reaction between the magnesium and the boron to produce magnesium diboride. The magnesium diboride may be used to facilitate the joining of the superconducting wire.

In one embodiment, the joining generally occurs at a temperature of about 650 to about 1000° C. Within this range, a temperature of greater than or equal to about 700, preferably greater than or equal to about 725, and more preferably greater than or equal to about 750° C., may be used. Also desirable are temperatures of less than or equal to about 950, preferably less than or equal to about 900, and more preferably less than or equal to about 875° C. An exemplary temperature is about 795 to about 850° C.

It is generally desirable to perform the joining in a manner so as to obtain a "bridge superconducting cross section" between the first end of the first superconducting wire and the second end of the second superconducting wire. When the bridge superconducting cross section is less than the superconducting cross section on the filament or the tape, the bridge superconducting cross section limits the current carrying capacity in the connected superconducting elements. Therefore, the bridge superconducting cross section is, preferably, at least as large as the superconducting cross section on the filament or the tapes.

The current carrying capacity of a formed joint can be tested by soldering voltage probes to the superconducting filament tape on both sides of the weld. The joint is cooled below the critical temperature of the superconductor and increasing amounts of current are passed through the weld while the voltage change between the probes is monitored. The current at which a sufficient voltage change is detected, e.g., about 0.02 microvolts, is the critical current. If the current carrying capacity in the weld is less than the current carrying capacity in the filament and/or tape, the number of bridges or size of the bridges can be increased in the joint to form a larger bridge superconducting cross section.

For example, a predetermined number of spot welds are used to form a superconducting joint by this method. If the joint has a lower current carrying capacity than the adjacent tape, the number of spot welds can be increased in the joint to provide a higher superconducting bridge cross section. A sufficient number of spot welds can be formed so that the current carrying capacity of the joint exceeds the current carrying capacity of the adjacent superconducting filament and/or tape.

A preferable bridge formation is diagonal across the exposed sections. For example, when a bridge is formed by resistance seam welding across the width of the exposed sections, preferably the resistance seam weld is formed diagonally across the width of the exposed sections. As a result, when the superconducting joint is formed current transfers from one tape to the other at various points across the width of the tape. This prevents the need for the current to transfer at a single point across the width where the superconducting bridge cross section at that point will have to be at least the superconducting cross section in the adjoining tapes, or the joint will limit the current carrying capacity of the overall conductor.

Pressure may optionally be used to effect the joint and the amount of pressure used is generally dependent upon the geometry of the joint. The joined filaments of the superconducting wire may be optionally subjected to additional post joining heat treatments to improve the superconducting properties of the joint. The post joining heat treatments are conducted at temperatures of greater than or equal to about 600, preferably greater than or equal to about 700, and more preferably 900° C., for a time period of about 1 to about 6 hours.

Figure 2:
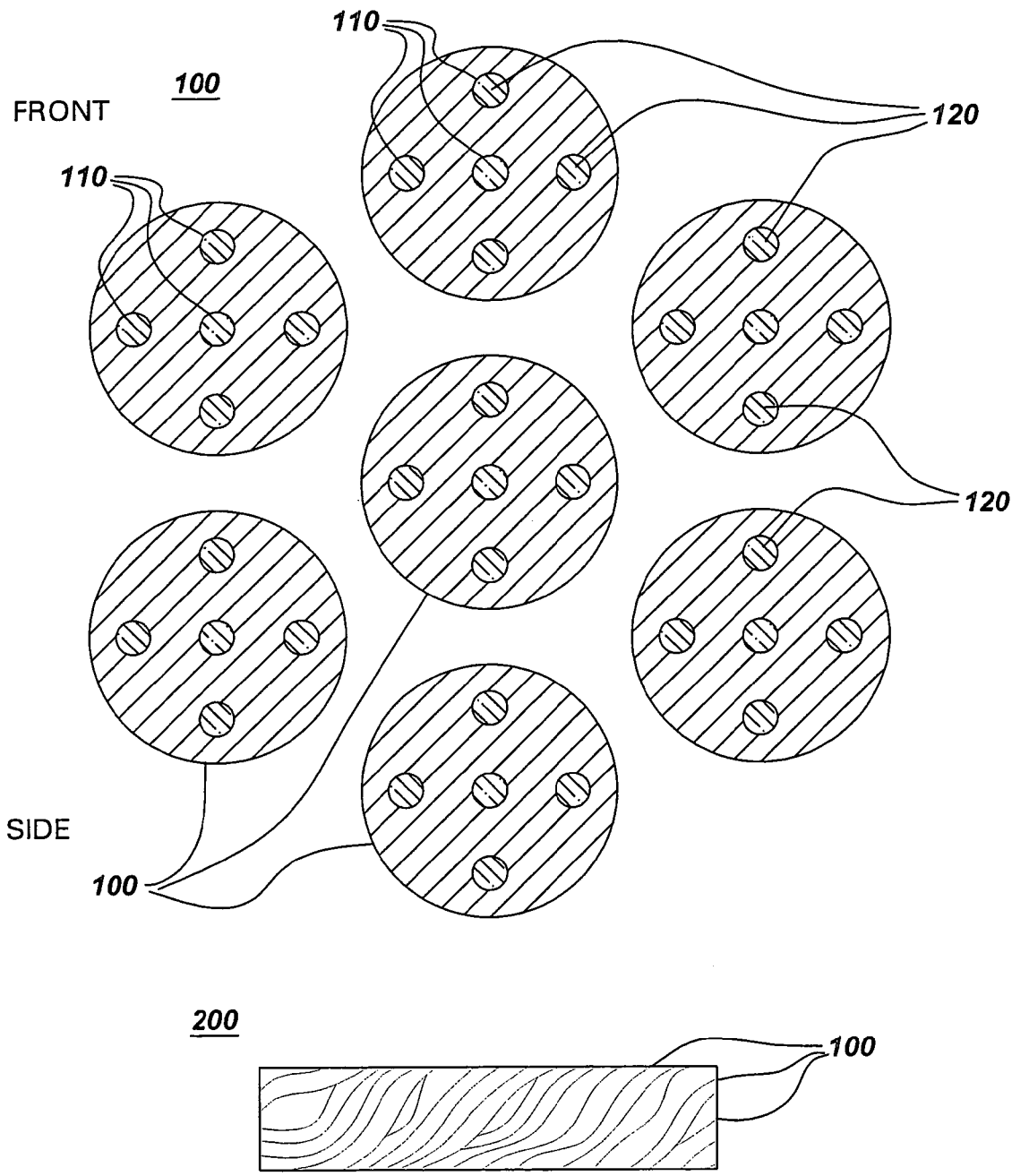
FIG. 2 is a schematic representation of side and cross-sectional views of a multi-wire cable formed from the superconducting wire.
Figure 3:
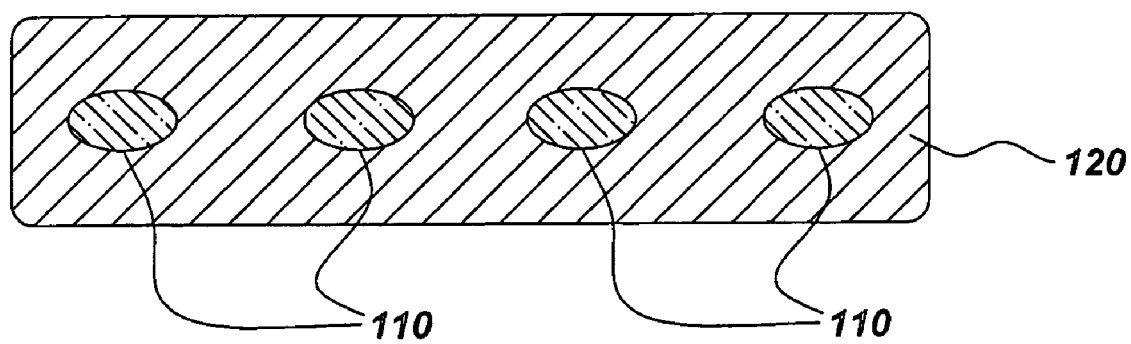
FIG. 3 is a schematic representation of a cross-sectional view of a flattened tape formed from the superconducting wire.

As stated above, these methods of joining may be effectively used to create extended sections of the superconducting wire that may be advantageously used in electrically conducting structures, including, but not limited to, flattened tapes, laminated wires formed from multiple wires, and wound multi-wire cables. Schematic views of multi-wire cable 200, flattened tape 300, and laminated wire 400 formed from superconducting wire 100 are shown in FIGS. 2 and 3, respectively. Applications for superconducting wire 100 are found in electromagnetic devices such as, but not limited to: superconducting magnets for motors, transformers, and generators. Such electromagnetic devices may in turn be incorporated into larger systems, such as, for example, a magnetic resonance imaging system.

While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method of manufacturing a wire comprising:
   filling a hole in a metal tube with magnesium;
   sealing the ends of the tube;
   deforming the tube to increase its length; and
   contacting the tube with boron to react the magnesium with the boron to form superconducting magnesium diboride.

2. The method of claim 1 wherein the magnesium is in the form of magnesium rods, pellets, powder, particles, flakes, or a combination thereof, and wherein the metal tube comprises copper, copper alloys, stainless steel, tantalum, magnesium, or nickel alloys.

3. The method of claim 1 wherein the ratio of a radius of the hole to the radius of the tube is about 0.1 to about 0.99, prior to the deforming.

4. The method of claim 1 wherein the metallic tube does not react with boron, and wherein the metallic tube permits the diffusion of boron.

5. The method of claim 1 wherein the metallic tube further comprises additional non-Intersecting holes that extend from a first end of the tube through to the second end of the tube and wherein at least one of these holes is filled with the magnesium prior to the deforming process.

6. The method of claim 1 wherein the deforming is by extrusion, forging, rolling, swaging, drawing or a combination comprising at least one of the foregoing processes.

7. The method of claim 1 wherein the deforming results in an increase of a unit length of the metal tube in an amount of greater than or equal to about 10% after the deforming.

8. The method of claim 1 wherein the boron is in the form of a vapor or a liquid.

9. The method of claim 1 further comprising heat treating the wire at a temperature of greater than or equal to about 600° C. for a time period of greater than or equal to about 1 hour.

10. A method for making a superconducting wire comprising: contacting a boron filament, tape or a combination of a filament and a tape with molten magnesium to form a magnesium diboride wire, wherein the boron substrate is intermittently contacted with the molten magnesium.

11. The method of claim 10 wherein the boron filament has a characteristic dimension of about 1 to about 1,000 micrometers.

12. The method of claim 10 wherein the boron substrate is contacted with the molten magnesium at a temperature of about 650 to about 1090° C.

13. The method of claim 10 wherein the molten magnesium comprises dopants, and wherein the dopants are copper, gold, silver, magnesium, zinc, lead, cadmium, tin, bismuth, gallium, mercury, indium or combinations comprising at least one of the foregoing dopants.

14. The method of claim 10 wherein the filament is a film.

15. The method of claim 10 wherein the filament may be further deformed into a film or a tape.

* * * * *